(12) United States Patent
Sommer et al.

(10) Patent No.: US 11,906,608 B2
(45) Date of Patent: Feb. 20, 2024

(54) AUTOMATED DETECTION OF WATER-FAT SWAPS IN DIXON MAGNETIC RESONANCE IMAGING

(71) Applicant: KONINKLIJKE PHILIPS N.V., Eindhoven (NL)

(72) Inventors: Karsten Sommer, Hamburg (DE); Steffen Weiss, Hamburg (DE); Holger Eggers, Ellerhoop (DE)

(73) Assignee: Koninklijke Philips N.V., Eindhoven (NL)

( * ) Notice: Subject to any disclaimer, the term of this patent is extended or adjusted under 35 U.S.C. 154(b) by 162 days.

(21) Appl. No.: 17/604,454

(22) PCT Filed: Apr. 9, 2020

(86) PCT No.: PCT/EP2020/060138
§ 371 (c)(1),
(2) Date: Oct. 18, 2021

(87) PCT Pub. No.: WO2020/212244
PCT Pub. Date: Oct. 22, 2020

(65) Prior Publication Data
US 2022/0196769 A1    Jun. 23, 2022

(30) Foreign Application Priority Data
Apr. 19, 2019  (EP) .................................... 19170373

(51) Int. Cl.
*G01V 3/00* (2006.01)
*G01R 33/48* (2006.01)
(Continued)

(52) U.S. Cl.
CPC ..... *G01R 33/4828* (2013.01); *G01R 33/5608* (2013.01); *G01R 33/56563* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 6,091,243 A * 7/2000 Xiang ................ G01R 33/4828
324/309
2010/0111390 A1   5/2010 Fenchel et al.
(Continued)

OTHER PUBLICATIONS

Zhao et al "Identification of Water and Fat Images in Dixon MRI Using Aggregated Patch-Based Convolutional Neural Networks" Springer Int. Publishing 2016.
(Continued)

*Primary Examiner* — Walter L Lindsay, Jr.

(57) ABSTRACT

Disclosed herein is a medical system (100, 300, 500) comprising a memory (110) storing machine executable instructions (120) and a convolutional neural network (122). The convolutional neural network is configured for receiving an initial Dixon magnetic resonance image (124, 126) as input. The convolutional neural network is configured for identifying one or more water-fat swap regions (128) in the initial Dixon magnetic resonance image. The medical system further comprises a processor (104) for controlling the medical system. Execution of the machine executable instructions causes the processor to: receive (200) the initial Dixon magnetic resonance image; and receive (204) the one or more water-fat swap regions from the convolutional neural network in response to inputting the initial Dixon magnetic resonance image into the convolutional neural network.

20 Claims, 9 Drawing Sheets

(51) Int. Cl.
*G01R 33/56* (2006.01)
*G01R 33/565* (2006.01)

(58) Field of Classification Search
USPC .......................................................... 324/309
See application file for complete search history.

(56) References Cited

U.S. PATENT DOCUMENTS

| | | | |
|---|---|---|---|
| 2014/0350386 A1 | 11/2014 | Eggers et al. | |
| 2015/0123658 A1* | 5/2015 | Zhong | G01R 33/4828 324/309 |
| 2017/0082713 A1 | 3/2017 | Fenchel et al. | |
| 2018/0089840 A1* | 3/2018 | Yan | G06T 7/0014 |

OTHER PUBLICATIONS

International Search Report and Written Opinion From PCT/EP2020/060138 dated Oct. 22, 2020.
Glocker et al "Correction of Fat Water Swaps in Dixon MRI" MICCAI 2016 p. 536-543.
Vemulapallli Raviteja et al "Unsupervised Cross-Modal Synthesis of Subject Specific Scans" 2015 IEEE International Conf. on Computer Vision, Dec. 7, 2015 p. 630-638.
Jonathan Anderson et al "Separation of Water and Fat Signal in Whole Body Gradient Echo Scans Using Convolutional Neural Networks" Arxiv. Org Dec. 12, 2018.
Cho et al "Robust Water Fat Separation in Mutli-Echo GRE Sequence Using Patch-Based Neural Network" Int. Soc. for Magnetic Reson in Med. Jun. 1, 2018 p. 5610.
Ahmad et al "A Method for Automatic Identification of Water and Fat Images From a Symmetrically Sampled Dual Echo Dixon Technique" Magnetic Reson. Imaging 28 (2010) p. 427-433.
Eggers et al "Chemical Shift Encoding Based Water-Fat Separation Methods" Journal of Magnetic Resonance Imaging 40 p. 251-268.
Ladefoged et al "Impact of Incorrect Tissue Classification in Dixon Based MR-AC, Fat Water Tissue Inversion" Physics 2014.
Jonathan Long, Evan Shelhamer, Trevor Darrell; "Fully Convolutional Networks for Semantic Segmentation" Proceedings of the IEEE Conference on Computer Vision and Pattern Recognition (CVPR), 2015, pp. 3431-3440.
Yang et al "Automated Assessment of Thigh Composition Using Machine Learning for Dixon Magnetic Resonance Images" Magn. Reson Mater Phy. (2016) 29 p. 723-731.
Chartsias et al "Multimodal MR Synthesis via Modality-Invariant Latent Representation" IEEE Transactions on Medical Imaging, vol. 37, No. 3, Mar. 2018.

* cited by examiner

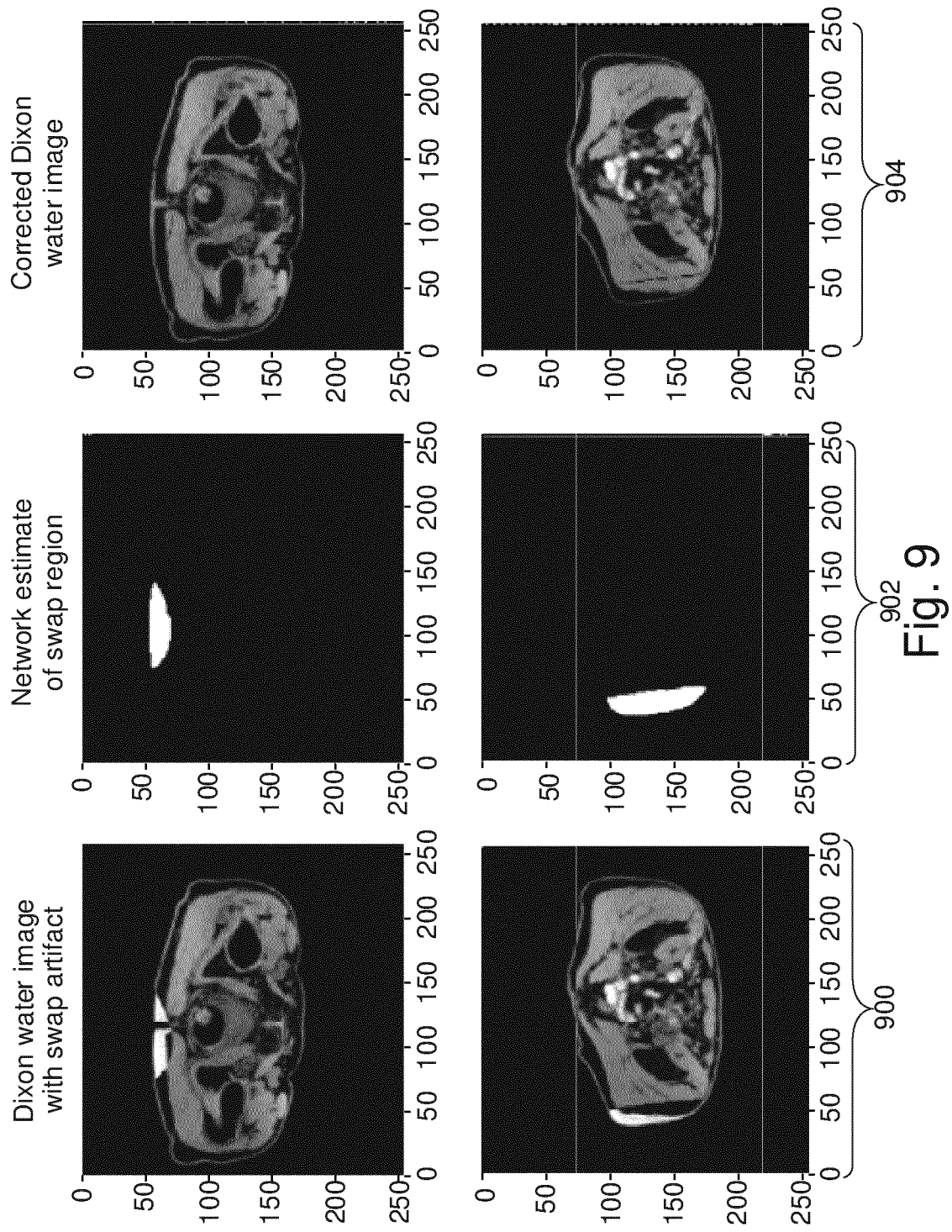

AUTOMATED DETECTION OF WATER-FAT SWAPS IN DIXON MAGNETIC RESONANCE IMAGING

CROSS REFERENCE TO RELATED APPLICATIONS

This application is a U.S. national phase application of International Application No. PCT/EP2020/060138 filed on Apr. 9, 2020, which claims the benefit of EP Application Serial No. 19170373.5 filed on Apr. 19, 2019 and is incorporated herein by reference.

FIELD OF THE INVENTION

The invention relates to Magnetic Resonance Imaging, in particular to Dixon methods of magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by a transmitter coil cause perturbations to the local magnetic field, and RF signals emitted by the nuclear spins are detected by a receiver coil. These RF signals are used to construct the MM images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

MRI scanners are able to construct images of either slices or volumes. A slice is a thin volume that is only one voxel thick. A voxel is a small volume over which the MRI signal is averaged, and represents the resolution of the MRI image. A voxel may also be referred to as a pixel herein.

Dixon methods of magnetic resonance imaging include a family of techniques for producing separate water and lipid (fat) images. The various Dixon techniques such as, but not limited to, two-point Dixon Method, three-point Dixon method, four-point Dixon method, and six-point Dixon Method are collectively referred to herein as Dixon techniques or methods. There are typically multiple solutions when reconstructing the water and fat images. It is possible to inadvertently switch voxels between the water and fat images; this is referred to a water-fat swap herein.

United States patent application publication US20170082713A1 discloses a method and apparatus for the automatic assignment of at least one combination image of an examination object to a spin species represented in the combination image, relationships, which were determined from an existing database and which relate to the assignment of spin species to combination images, are loaded into a computer. At least two MR datasets at one of at least two echo times in each case following an excitation by means of a multi-contrast measurement are supplied to the computer. At least one combination image is determined in the computer from the at least two MR datasets. The spin species represented in the at least one combination image is assigned in the computer on the basis of the loaded relationships. By using relationships determined from an existing database, an automatic unambiguous global assignment of the correct spin species is enabled.

The paper '*Correction of fat-water swaps in Dixon MRI*' by B. Glocker et al. in MICCAI 2016 addresses the problem of fat-water invention in Dixon MRI. This corresponds to the object of the present invention. However, this paper proposes a solution (the Dixon-Fix) that is based on a regression approach and learning a conditional distribution of image appearance.

SUMMARY OF THE INVENTION

The invention provides for a medical system, a computer program product, and a method in the independent claims. Embodiments are given in the dependent claims.

A difficulty when reconstructing fat and water images during a Dixon magnetic resonance imaging protocol are water-fat swaps. A water-fat swap of water-fat swap region is a region or group of voxels where within a Dixon magnetic resonance image (or Dixon image) the water and fat regions have been misidentified. Embodiments provide a method of automatically identifying one or more water-fat swaps using a convolutional neural network. The one or more water-fat swaps are the identification of voxels in the magnetic resonance image. The one or more water-fat swaps can be for example given in the form of the location of voxels. More conveniently the one or more water-fat swaps can be identified using a mask. Masks are images which may identify the location of the one or more water-fat swaps. If there are no water-fat swaps then the mask can be empty and/or indicate that there are no water-fat swaps. References to masks herein refer to images which may be used to identify the location of water-fat swaps if water-fat swaps are present in a Dixon magnetic resonance image.

The convolutional neural network can identify the location of the one or more water-fat swap regions to aid a human interpreting or correcting Dixon images. The convolutional neural network can also be incorporated into automated algorithms that iteratively remove the water-fat swap regions from Dixon images.

The invention provides for a medical system that comprises a memory storing machine-executable instructions and a convolutional neural network. The convolutional neural network is configured or trained for receiving an initial Dixon magnetic resonance image as input. The convolutional neural network is configured for identifying one or more water-fat swap regions in the initial Dixon magnetic resonance image.

The initial Dixon magnetic resonance image as used herein encompasses a fat and/or a water image and/or fat fraction image and/or an R2* image reconstructed according to a Dixon magnetic resonance imaging protocol. Water-fat swaps will be visible in any of these images reconstructed using Dixon methods. The convolutional neural network is configured for taking different types of input. The input to the convolutional neural network may for example be any one of the following: a water Dixon image, a fat Dixon image, or both a water Dixon image and a fat Dixon image, a fat fraction image, an R2* image, and combinations thereof. It is possible to identify a water-fat swap region by looking at just a water Dixon image similarly as it is possible to identify it by looking at just a fat Dixon image. It may be easier to train and have higher accuracy if the convolutional neural network is trained taking both a paired water and fat Dixon magnetic resonance image as input. However, this is not necessary as the convolutional neural network can be trained to also look at just the water or just the fat image.

A medical system as used herein encompasses a system configured for performing image processing and/or numerical techniques on medical data or medical imaging data.

The medical system further comprises a processor configured for controlling the medical system. Execution of the machine-executable instructions causes the processor to receive the initial Dixon magnetic resonance image. Execution of the machine-executable instructions further causes the processor to receive the one or more water-fat swap regions from the convolutional neural network in response to inputting the initial Dixon magnetic resonance image into the convolutional neural network. This embodiment may be beneficial because it may provide for an automatic means of identifying water-fat swap regions in Dixon magnetic resonance images. This for example may be useful in quality control of Dixon magnetic resonance images as well as being incorporated into automated algorithms for reconstructing Dixon magnetic resonance images.

In another embodiment execution of the machine-executable instructions further causes the processor to reconstruct a corrected Dixon magnetic resonance image using the received one or more water-fat swap regions. This embodiment may be beneficial because it may provide for a means of improving the quality of Dixon magnetic resonance images.

In another embodiment the Dixon magnetic resonance image is corrected by swapping voxels of the one or more water-fat swap regions between the fat image and the water image. The Dixon magnetic resonance image comprises the fat image and the water image. In this example, which is particularly applicable to a two-point Dixon method, the voxels which are identified as being the water-fat swap regions are simply exchanged with each other. This may provide for a simple means of providing the corrected Dixon magnetic resonance image.

In another embodiment the Dixon magnetic resonance image is corrected by reconstructing the Dixon magnetic resonance image from Dixon magnetic resonance imaging data according to a Dixon magnetic resonance imaging reconstruction algorithm. The Dixon magnetic resonance imaging reconstruction algorithm is configured to use the one or more water-fat swap regions as constraints and/or for correcting a B0 inhomogeneity estimation. In the case where there are constraints the algorithm can be constrained to properly identify the regions as being water or fat when the solutions are determined. Likewise, using the one or more water-fat swap regions to correct the B0 inhomogeneity estimation may also provide for a corrected Dixon magnetic resonance image.

The Dixon magnetic resonance imaging data is magnetic resonance imaging data that was acquired according to a Dixon magnetic resonance imaging protocol and can be reconstructed into a water and fat image according to a Dixon magnetic resonance imaging protocol.

In another embodiment execution of the machine-executable instructions further causes the processor to receive training data. Each of the training data comprises a training Dixon magnetic resonance image and a training water-fat swap mask. The training water-fat swap mask may identify a ground truth of the one or more water-fat swap regions. Some of the training Dixon magnetic resonance images will not have water-fat swaps, and their masks may indicate this. Execution of the machine-executable instructions further causes the processor to train the convolutional neural network using the training data. Likewise, in this embodiment the training Dixon magnetic resonance image can be simply a water image, a fat image, or a combination of a water and fat image. As such the convolutional neural network can be trained to work with one image as input or two images. If there is a single image as input it may be just the water or the fat image. If it is both then a matched pair of a water and a fat image are both input.

In another embodiment execution of the machine-executable instructions further cause the processor to receive swap-free Dixon magnetic resonance images. The swap-free Dixon magnetic resonance images are Dixon magnetic resonance images that are correct in that they do not have regions which have their water and fat regions switched. Again, the swap-free Dixon magnetic resonance images could just be a swap-free water Dixon magnetic resonance image, a swap-free fat Dixon magnetic resonance image, or a matched pair of both a water and a fat image. Execution of the machine-executable instructions further causes the processor to generate the training data by generating synthetic water-fat swap regions in each of the swap-free Dixon magnetic resonance image of the swap-free Dixon magnetic resonance images and constructing the training water-fat swap mask. This embodiment may be beneficial because it starts with images that are guaranteed to not have any water-fat swap regions. To make the training data the algorithm then artificially adds these water-fat swap regions. This can be performed in a variety of ways, for example the regions can be simply swapped or it may be done according to any of the following algorithms which is detailed below.

In another embodiment the training data is at least partially generated by determining at least some of the one or more synthetic water-fat swap regions by firstly determining one or more random variables, then by inputting the one or more random variables into a spatially variable function, and then thresholding the spatially variable function to determine the one or more water-fat swap regions for the training Dixon magnetic resonance image. In this embodiment the location of the water-fat swap regions is determined randomly.

In another embodiment the training data is at least partially generated by identifying high water-fat swap zones in the Dixon magnetic resonance image with both a fat content and water content above a predetermined water-fat threshold. The training data is at least partially generated by selecting at least a portion of the high water-fat zones as the synthetic water-fat swap regions. The high water-fat zones are regions or voxels which contain both a high water and fat content. If the voxel contains equal portions of water and fat there would be 50% water and 50% fat. In this case the Dixon magnetic resonance image is more likely to have errors when it is reconstructed by an automatic algorithm. These voxels that have both a high water and fat content are then likely to cause water-fat swaps when an automated algorithm is used. Identifying these high water-fat zones and then selecting at least a portion of them is one way of producing realistic training water-fat swap regions.

For example, voxels with a non-negligible content of both water and fat say both above 30% content for both components may qualify. This can occur for example at tissue boundaries or in conditions such as a fatty liver disease.

In another embodiment the training data is at least partially generated by receiving a B0 inhomogeneity map for the swap-free Dixon magnetic resonance image. For example, when the magnetic resonance data for the swap-free Dixon magnetic resonance image was acquired a B0 inhomogeneity map may also be stored and used at this point. The training data is at least further partially generated by identifying high B0 inhomogeneity zones in the swap-free Dixon magnetic resonance image by thresholding the B0 inhomogeneity map with a predetermined B0 inhomogeneity threshold. The training data is at least further partially generated by selecting at least a portion of the high B0 inhomogeneity zones as the training water-fat swap regions. This embodiment may be beneficial because in regions where there is higher B0 inhomogeneity automated algorithms are more likely to incorrectly identify a region as being water or fat.

This could also be considered as developing a risk factor or a swap probability that a particular region may be swapped in a real Dixon magnetic resonance image. These artificial or synthetic swap regions may then be generated based on this map or the B0 inhomogeneity map. This may lead to a more realistic training dataset than using say for example random regions.

In another embodiment the training data is at least partially generated by identifying tissue boundary zones in the swap-free Dixon magnetic resonance image using an image segmentation algorithm. For example, standard image segmentation techniques may be used to identify different tissue regions. The training data is further at least partially generated by selecting at least a portion of the tissue boundary zones or a region surrounding these as the training water-fat swap regions. This embodiment may also be further beneficial because in the zones adjacent to transitions between tissue types it is also likely or possible that an automated Dixon magnetic resonance imaging algorithm will incorrectly identify a region as being water or fat. This is because there may be strong local signal gradients which may make it more difficult to properly solve the equations and differentiate between fat and water regions.

In another embodiment the training data is at least partially generated by determining a spatially dependent signal-to-noise map for the Dixon magnetic resonance image. The training data is further at least partially generated by selecting at least a portion of the training water-fat swap regions for inclusion in the training dataset using a signal-to-noise weighting factor determined using the spatially dependent signal-to-noise map. The signal-to-noise weighting factor increases as the spatially dependent signal-to-noise map decreases. For example, the lower the signal-to-noise the more likely a water-fat swap occurs in an automated Dixon magnetic resonance imaging algorithm.

In another embodiment the training data is at least partially generated by receiving an isocenter location for the swap-free Dixon magnetic resonance image. The training data is further at least partially generated by selecting at least a portion of the synthetic water-fat swap regions for inclusion in the training data using a distance weighting factor determined by a distance from the isocenter location. The distance weighting factor increases as the distance from the isocenter location increases. In general, a water-fat swap is more likely to increase as the distance from the isocenter increases. Often times this is related to an increase in the B0 inhomogeneity. However, using the distance from the isocenter as a weighting factor may enable a better selection of regions to generate synthetic water-fat swap regions.

In another embodiment the training data is at least partially generated by increasing the size of the training data by generating additional training magnetic resonance images by applying an image transform to the training Dixon magnetic resonance images as well as to the training water-fat swap mask for each of the training Dixon magnetic resonance images. The image transformation comprises any one of the following: an image translation, an image rotation, an image deformation, an image flipping transformation, a mirror image transformation, and combinations thereof. This may be a way of increasing the training database or data used for training the convolutional neural network. This may enable training with a smaller amount of training data.

The medical imaging system further comprises a magnetic resonance imaging system. The memory further contains pulse sequence commands configured for controlling the magnetic resonance imaging system to acquire magnetic resonance imaging data according to a Dixon magnetic resonance imaging protocol. Execution of the machine-executable instructions further cause the processor to acquire the magnetic resonance image by controlling the magnetic resonance imaging system with the pulse sequence commands.

Execution of the machine-executable instructions further cause the processor to reconstruct the initial Dixon magnetic resonance image using the magnetic resonance imaging data according to the Dixon magnetic resonance imaging protocol. This embodiment may be beneficial because as the magnetic resonance imaging data is acquired by the magnetic resonance imaging system the convolutional neural network is used to automatically identify the one or more water-fat swap regions and may for example be used to automatically improve the quality of the Dixon magnetic resonance images.

In the above embodiment the medical system was a magnetic resonance imaging system. Embodiments may be embodied in other types of systems as well. For example, in one embodiment the medical system is an on-line service that provides a correction of the fat and/or water image as part of an image reconstruction software. In another embodiment the medical system is a retrospective water-fat swap correction tool that can be executed for example on a diagnostic workstation. In yet another example the medical system may be a swap correction method that may be independent of the particular vendor or manufacturer of the medical system. For example, this may be implemented or marketed as a cloud-based service which can be provided.

In another aspect the invention provides for a computer program product comprising machine-executable instructions for execution by a processor controlling the medical system and a convolutional neural network. The convolutional neural network is configured for receiving an initial Dixon magnetic resonance image as input. Again, the initial Dixon magnetic resonance image may be a fat Dixon magnetic resonance image, a water Dixon magnetic resonance image, or a matched pair of a fat and water Dixon magnetic resonance image. The convolutional neural network is configured for identifying one or more water-fat swap regions in the initial Dixon magnetic resonance image. Execution of the machine-executable instructions further causes the processor to receive the initial Dixon magnetic resonance image. Execution of the machine-executable instructions further cause the processor to receive the one or more water-fat swap regions from the convolutional neural network in response to inputting the initial Dixon magnetic resonance image into the convolutional neural network. The advantages of this system have been previously discussed.

In another aspect the invention provides for a method of training a convolutional neural network. The convolutional neural network is configured for receiving an initial Dixon magnetic resonance image as input. The convolutional neural network is configured for identifying or trained for identifying one or more water-fat swap regions in the initial Dixon magnetic resonance image. The method comprises receiving training data. Each of the training data comprises a training Dixon magnetic resonance image and a training water-fat swap mask. The training Dixon magnetic resonance image comprises the one or more water-fat swap regions. The training water-fat swap mask identifies a ground truth of the one or more water-fat swap regions.

The method further comprises training the convolutional neural network using the training data. As was mentioned above previously, the training Dixon magnetic resonance image could for example be a water Dixon magnetic resonance image, a fat Dixon magnetic resonance image, or may be a pair of matched images where one is a water Dixon magnetic resonance image and the other is a fat Dixon magnetic resonance image.

In another embodiment the method further comprises receiving swap-free Dixon magnetic resonance images. The method further comprises generating the training data by generating synthetic water-fat swap regions in the swap free Dixon magnetic resonance images. The synthetic water-fat swap regions then function as the training water-fat swap mask.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the interne, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which:

FIG. 9 demonstrates the use of the convolutional neural network of FIG. 8.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
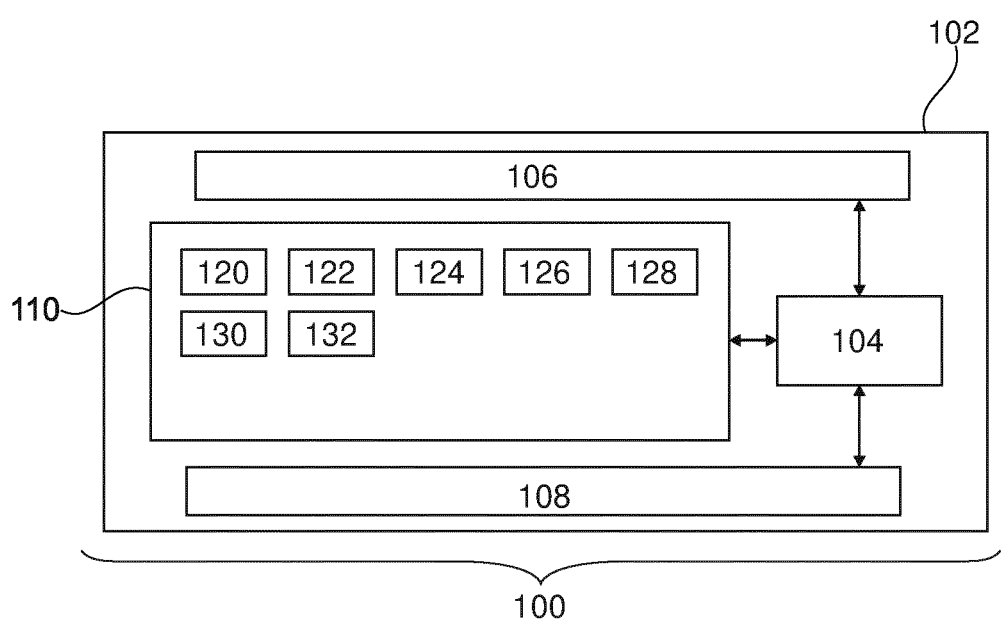
FIG. 1 illustrates an example of a medical system.

FIG. 1 illustrates an example of a medical system 100. In this example the medical system comprises a computer 102 that has a processor 104. The processor is shown as being connected to an optional hardware interface 106. The hardware interface 106 may for example enable the processor 104 to communicate with other components of the medical system 100 or even to exchange data with other computer systems or information systems. The processor 104 is further shown as being connected to an optional user interface 108 and a memory 110. The memory 110 may for example represent different types of memory which a processor 104 may have access to.

The memory 110 may be any combination of memory which is accessible to the processor 104. This may include such things as main memory, cached memory, and also non-volatile memory such as flash RAM, hard drives, or other storage devices. In some examples the memory 110 may be considered to be a non-transitory computer-readable medium.

The memory 110 is shown as containing machine-executable instructions 120. The machine-executable instructions 120 enable the processor 104 to perform various control functions and/or data processing and image processing techniques. The memory 110 is further shown as containing an implementation of a convolutional neural network 122. The convolutional neural network is configured for identifying one or more water-fat swap regions in response to having an initial Dixon magnetic resonance image input into it. The memory 110 is shown as containing an initial Dixon fat magnetic resonance image 124 and an initial Dixon water magnetic resonance image 126.

The convolutional neural network 122 could be configured to work with either the initial fat magnetic resonance image 124 or the initial Dixon magnetic resonance image 126. In some other cases the convolutional neural network 122 takes both the initial Dixon fat magnetic resonance image 124 and the initial Dixon water magnetic resonance image 126 as input. In these various examples the convolutional neural network then outputs one or more water-fat swap regions 128 in response. The memory 110 is shown as containing the one or more water-fat swap regions 128. The one or more water-fat swap regions 128 is identification of voxel or voxels within the initial Dixon fat magnetic resonance image 124 or initial Dixon water magnetic resonance image 126 where the water and fat regions have been swapped. The identification of the one or more water-fat swap regions 128 are useful in evaluating the Dixon magnetic resonance images 124, 126.

In some cases, the machine-executable instructions 120 will be further programmed to take the one or more water-fat swap regions 128 and calculate a corrected Dixon fat magnetic resonance image 130 and a corrected Dixon water magnetic resonance image 132. In some cases, this may involve just a switching of the voxel between the two images 130 and 132. In other cases, the magnetic resonance data which was used to construct the initial Dixon magnetic resonance images 124, 126 in input to an algorithm which uses the one or more water-fat swap regions 128 to make corrections. For example, the one or more water-fat swap regions 128 could work as a constraint or could be used to correct a B0 inhomogeneity estimation.

Figure 2:
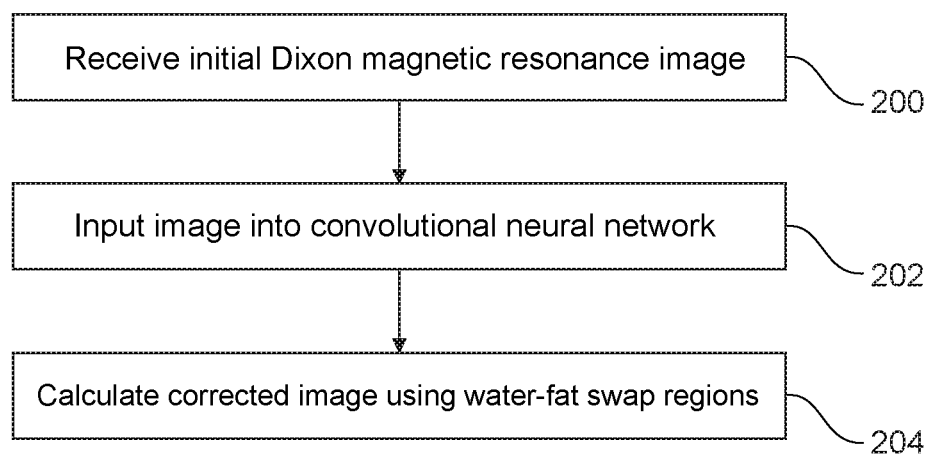
FIG. 2 shows a flow chart which illustrates a method of operating the medical system of FIG. 1.

FIG. 2 shows a flowchart which illustrates a method of operating the medical system 100 of FIG. 1. First in step 200 the initial Dixon magnetic resonance image 124 and/or 126 is received. Next in step 202 the initial Dixon magnetic resonance image 124 and/or 126 is input into the convolutional neural network 122 and as an output the one or more water-fat swap regions 128 is received. In some examples the step 204 is performed. In step 204 the corrected Dixon magnetic resonance image 130 and/or 132 is calculated using the one or more water-fat swap regions 128.

Figure 3:
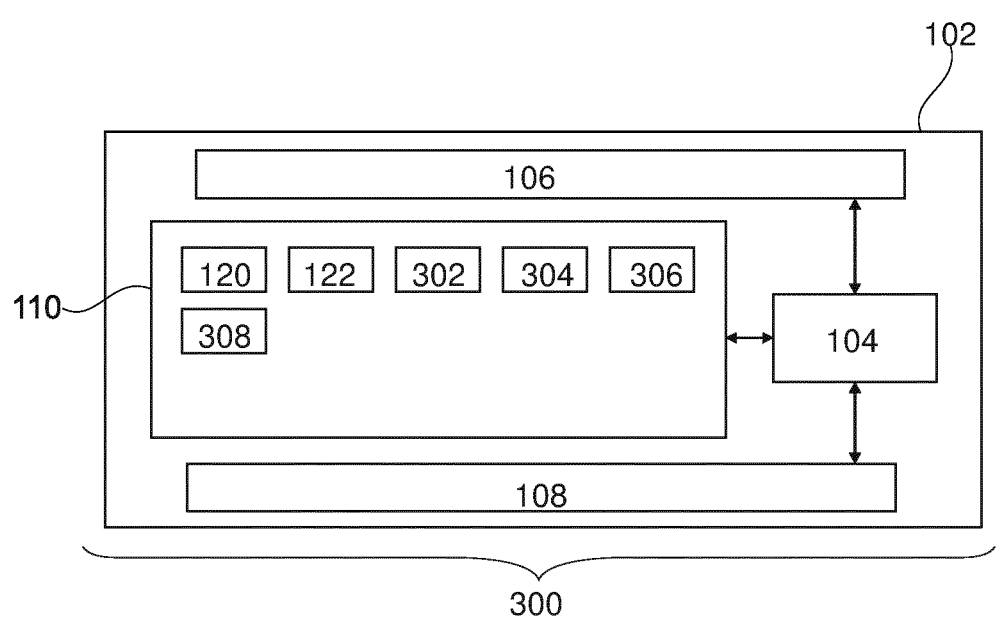
FIG. 3 illustrates a further example of a medical system.

FIG. 3 illustrates a further example of the medical system 300. It should be noted that the features of the medical system 300 may be freely combined with the features of the medical system 100 illustrated in FIG. 1. The memory 110 in this example is shown as again containing the machine-executable instructions 120 and the convolutional neural network 122. In addition 110, the memory is shown as containing swap-free Dixon magnetic resonance images 302. The swap-free Dixon magnetic resonance images are Dixon magnetic resonance images that do not contain any water-fat swaps. The swap-free Dixon magnetic resonance images 302 could be water images, fat images or both water and fat images as a pair. The memory 110 is further shown as containing synthetic water-fat swap regions 304. The various algorithms may be applied to the swap-free Dixon magnetic resonance images 302 to generate water-fat swap regions 304 for each of them.

The memory 110 is further shown as containing training data which combines training Dixon magnetic resonance image 306 and training water-fat swap masks 308. Again, the training Dixon magnetic resonance image 306 could be either fat, water, or both types of images matching the same type as the swap-free Dixon magnetic resonance images 302. The training water-fat swap mask 308 identifies the location of the synthetic water-fat swap regions 304. The training data 306, 308 may then be used to train the convolutional neural network 122 for example using deep learning.

Figure 4:
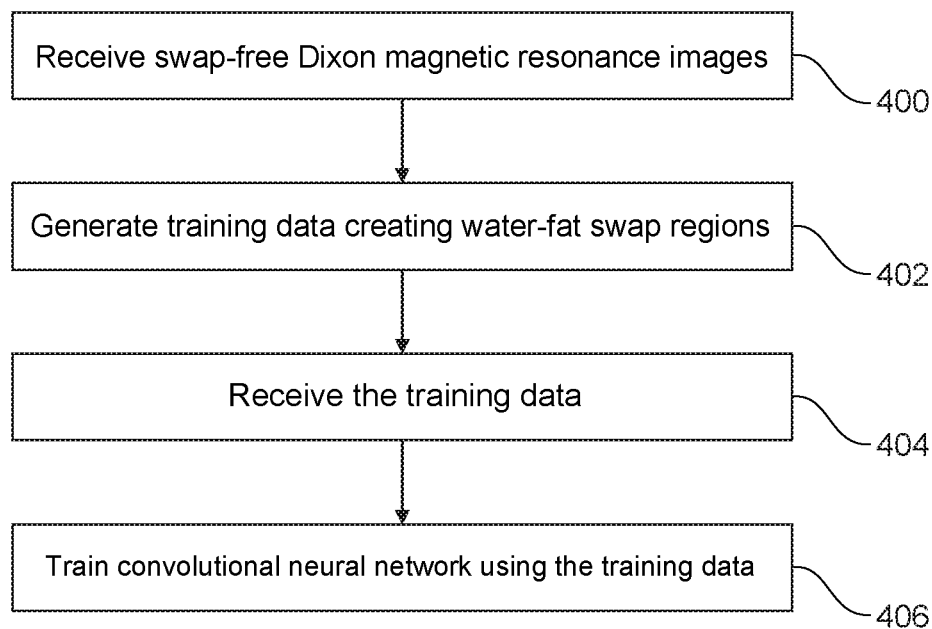
FIG. 4 shows a flow chart which illustrates a method of operating the medical system of FIG. 1.

FIG. 4 shows a flowchart which illustrates the method of using the medical system 300 of FIG. 3. The method of FIG. 4 may be combined with the method of FIG. 2. For example, the method of FIG. 4 could be performed first then followed by the steps of the method illustrated in FIG. 2.

The method of FIG. 4 starts with step 400. In step 400 the swap-free Dixon magnetic resonance images 302 are received. Next in step 402 the training data 306, 308 is generated by creating synthetic water-fat swap regions 304 for the swap-free Dixon magnetic resonance images 302. Next in step 404 the training data 306, 308 is received. Then finally in step 406 the convolutional neural network 122 is trained using the training data 306, 308.

Figure 5:
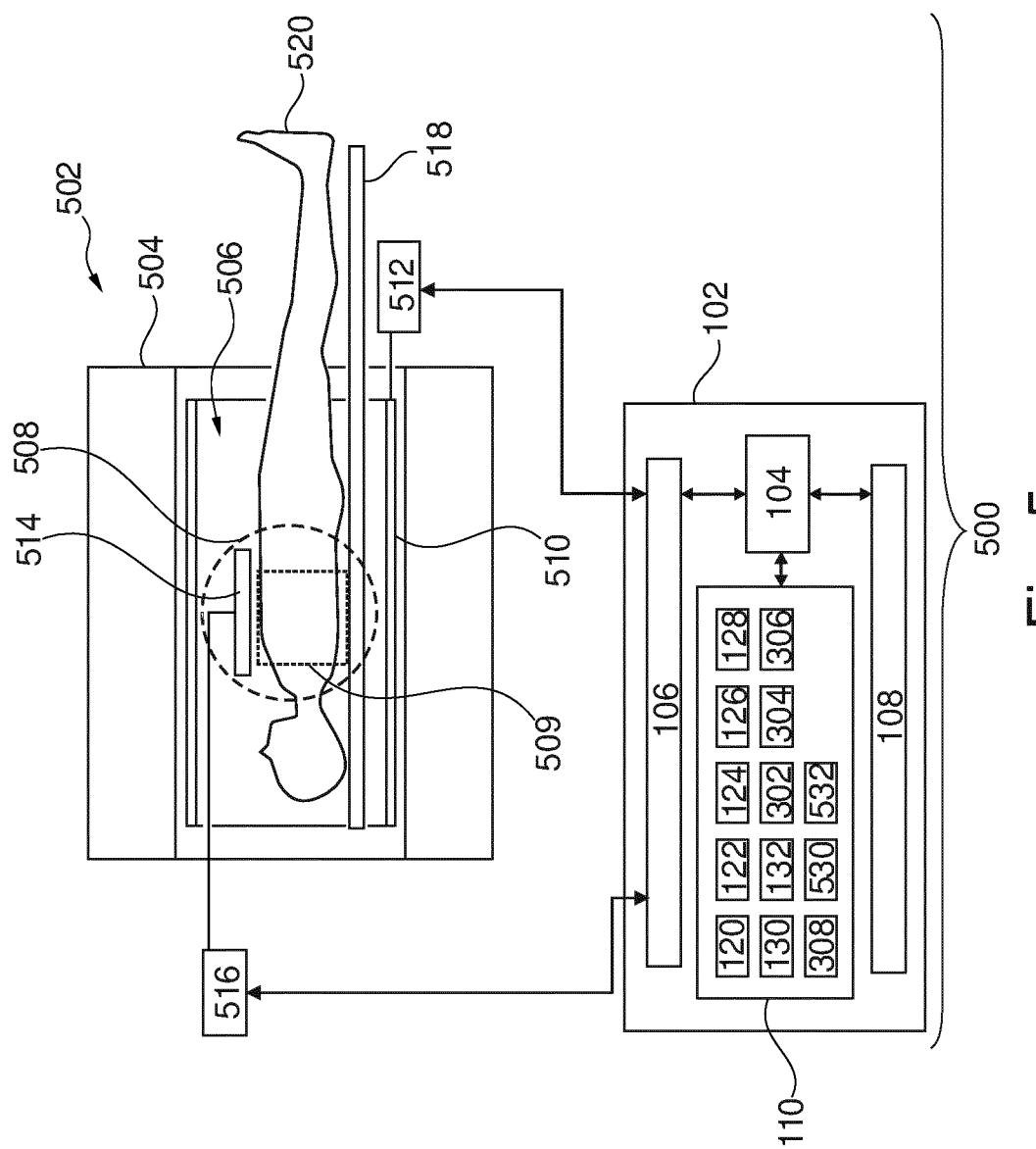
FIG. 5 illustrates a further example of a medical system.

FIG. 5 illustrates a further example of a medical system 500. The medical system 500 is similar to the medical system illustrated in FIG. 1 except that it additionally contains a magnetic resonance imaging system 502. The medical imaging system 500 is also shown as optionally incorporating the features of the medical imaging system 300 of FIG. 3.

The magnetic resonance imaging system 502 comprises a magnet 504. The magnet 504 is a superconducting cylindrical type magnet with a bore 506 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 506 of the cylindrical magnet 504 there is an imaging zone 508 where the magnetic field is strong and uniform enough to perform magnetic resonance imaging. A region of interest 509 is shown within the imaging zone 508. The magnetic resonance data that is acquired typically acquried for the region of interest. A subject 518 is shown as being supported by a subject support 520 such that at least a portion of the subject 518 is within the imaging zone 508 and the region of interest 509.

Within the bore 506 of the magnet there is also a set of magnetic field gradient coils 510 which is used for acquisition of preliminary magnetic resonance data to spatially encode magnetic spins within the imaging zone 508 of the magnet 504. The magnetic field gradient coils 510 connected to a magnetic field gradient coil power supply 512. The magnetic field gradient coils 510 are intended to be representative. Typically magnetic field gradient coils 510 contain three separate sets of coils for spatially encoding in three orthogonal spatial directions. A magnetic field gradient power supply supplies current to the magnetic field gradient coils. The current supplied to the magnetic field gradient coils 510 is controlled as a function of time and may be ramped or pulsed.

Adjacent to the imaging zone 508 is a radio-frequency coil 514 for manipulating the orientations of magnetic spins within the imaging zone 508 and for receiving radio transmissions from spins also within the imaging zone 508. The radio frequency antenna may contain multiple coil elements. The radio frequency antenna may also be referred to as a channel or antenna. The radio-frequency coil 514 is connected to a radio frequency transceiver 516. The radio-frequency coil 514 and radio frequency transceiver 516 may be replaced by separate transmit and receive coils and a separate transmitter and receiver. It is understood that the radio-frequency coil 514 and the radio frequency transceiver 516 are representative. The radio-frequency coil 514 is intended to also represent a dedicated transmit antenna and a dedicated receive antenna. Likewise the transceiver 516 may also represent a separate transmitter and receivers. The radio-frequency coil 514 may also have multiple receive/transmit elements and the radio frequency transceiver 516 may have multiple receive/transmit channels. For example if a parallel imaging technique such as SENSE is performed, the radio-frequency could 514 will have multiple coil elements.

The transceiver 516 and the gradient controller 512 are shown as being connected to the hardware interface 106 of a computer system 102. The memory 110 is further shown as containing pulse sequence commands. The pulse sequence commands 530 are commands or data which may be translated into such commands which control the magnetic resonance imaging system 502 to acquire magnetic resonance imaging data according to a Dixon magnetic resonance imaging protocol.

The memory 110 is further shown as containing magnetic resonance imaging data 532 that has been acquired by controlling the magnetic resonance imaging system 502 with the pulse sequence commands 530. The magnetic resonance imaging data 532 may be reconstructed using a Dixon magnetic resonance imaging protocol into the initial Dixon fat magnetic resonance image 124 and the initial Dixon water magnetic resonance image 126.

Figure 6:
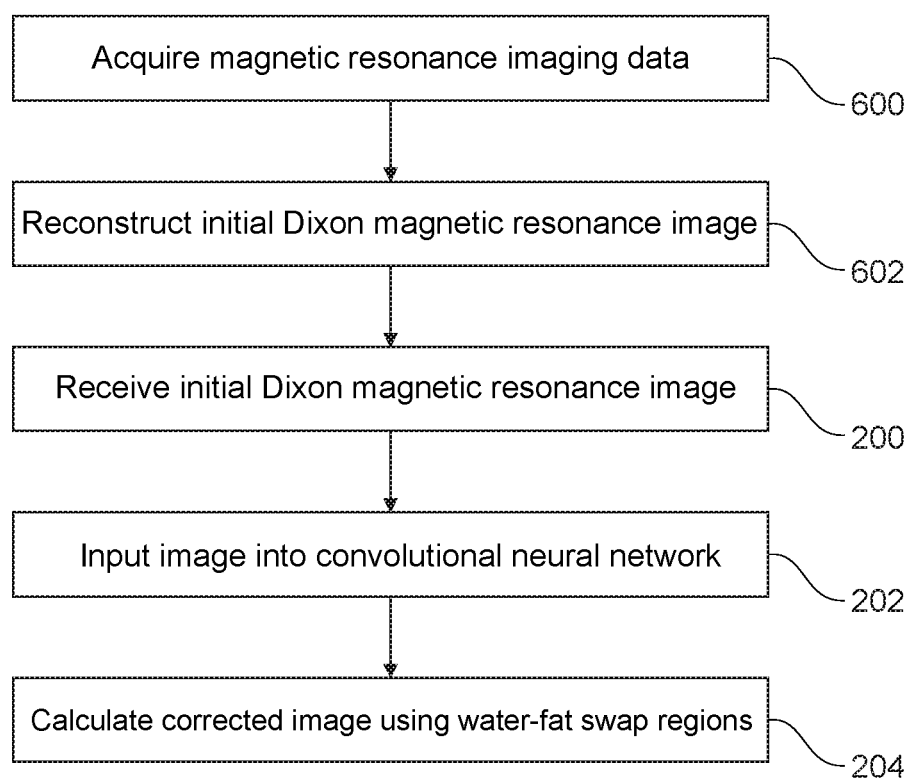
FIG. 6 shows a flow chart which illustrates a method of operating the medical system of FIG. 1.

FIG. 6 illustrates a method of operating the medical system 500 of FIG. 5. First in step 600 the magnetic resonance imaging system 502 is controlled with the pulse sequence commands 530 to acquire the magnetic resonance imaging data 532. Next in step 602 the initial Dixon magnetic resonance images 124 and 126 are reconstructed from the magnetic resonance imaging data 532. The method then proceeds to steps 200, 202 and 204 as are illustrated in FIG. 2.

Examples may provide for a method for automatic detection and correction of water-fat swaps in Dixon images. Examples may use a neural network (convolutional neural network 122) that is trained to identify water-fat swaps using a dataset (training data 702) with ground truth swap masks (training water-fat swap mask 308). During use, the network's output can be used either for direct correction of the swaps, or as input to a second Dixon reconstruction that yields Dixon images (corrected Dixon images 124, 126) without water-fat swaps.

Fat suppression is an essential element to improve the diagnostic value of Magnetic Resonance (MR) imaging because fat often hides details of other structures due to its high signal intensity. Suppression of fat is also important because it can help to delineate structures of neighboring aqueous tissue. Two-thirds of MR studies utilize some form of fat suppression. Dixon imaging has become a widely used technique to achieve more robust fat suppression than conventional methods based on spectral or T1 selection in the acquisition. Some implementations provide improved fat suppression over large fields of view in oncological and musculoskeletal applications, but also enables new applications such as subtraction-free MR angiography based on the water-only mDIXON images acquired with a contrast agent. Separation of water and fat based on two-point Dixon methods faces a fundamental ambiguity: two solutions for the water and fat signal, corresponding to different phase errors, are consistent with the acquired signals. This can lead to so-called water-fat swaps, i.e. regions of the image where the water signal is misallocated to the fat signal, and vice versa.

Many variants of the original Dixon method have been developed to achieve robust separation of the two species, often relying on the assumption of a spatially smooth main magnetic field (B0) inhomogeneity. Nevertheless, water-fat swaps still occur. They mostly appear in body parts which are located far from the isocenter, in regions where large B0 inhomogeneities are present, or in regions around slightly magnetic materials, e.g. implants.

In magnetic resonance imaging, water-fat swaps are problematic for several reasons:

If the Dixon method is used for fat suppression, fat signal with high signal intensity appears in regions with aqueous tissue with swaps.

In certain cases, e.g. where fat suppression is used to provide contrast between aqueous tissue embedded in adipose tissue, image interpretation is complicated and respective lesions may be missed.

Quantitative analysis of Dixon scans, e.g. for overall water-fat composition analysis, yields wrong results in the presence of water-fat swaps.

Use of Dixon images for calculation of radiation attenuation maps in radiation therapy planning may lead to incorrect dose calculations in the presence of water-fat swaps, because water and fat have different attenuation properties. The same applies to attenuation correction in PET-MR.

To address one or more of these problems, in an example a neural network 122 is trained on an artificially created dataset (synthetic water-fat swap regions 304 and training Dixon magnetic resonance images 306) to automatically detect and localize water-fat swaps in Dixon images. After training, the network can be applied to unseen data to identify voxels with swapped water-fat signal (902). This information can be used either to directly correct the images (904), or as input to a second Dixon reconstruction that yields Dixon images without swaps.

Convolutional neural networks typically consist of a sequence of convolutional and max pooling layers, followed by one or more fully connected layers. For image segmentation purposes, fully convolutional networks are often used. Unlike classification networks, they exhibit a symmetric structure (with de-convoluting and un-pooling layers replacing the fully connected layers) allowing for the efficient generation of predictions at pixel level.

For the training of such a network, a dataset with suitable images and ground truth segmentations are used. A large dataset with artificial water-fat swaps can easily be generated based on a set of Dixon scans (swap free Dixon magnetic resonance images 302) of the anatomy of interest.

An artificially swapped region may e.g. be defined by applying a suitable threshold on a randomly generated slowly varying two-dimensional function (polynomial, radial, Gaussian, . . . ). The water and fat signals in this region, described by a swap mask (training water-fat swap mask 308), are then swapped between the Dixon water and fat images, and the swap mask represents the ground truth segmentation. The two images as well as the mask are then saved to disk to be used during training. By applying data augmentation schemes such as translation, rotation, deformation, or flipping to the Dixon images before the swapping, a large training dataset with high anatomical variability may be generated.

Once this training data is available, a suitable objective function that represents the accuracy of the predicted segmentation may be chosen. A common choice is the pixel-wise cross-entropy loss. The weights of the network may then be optimized using an optimization technique such as backpropagation-based stochastic gradient descent. A schematic overview of the proposed method is shown in FIGS. 7 and 8 below.

Figure 7:
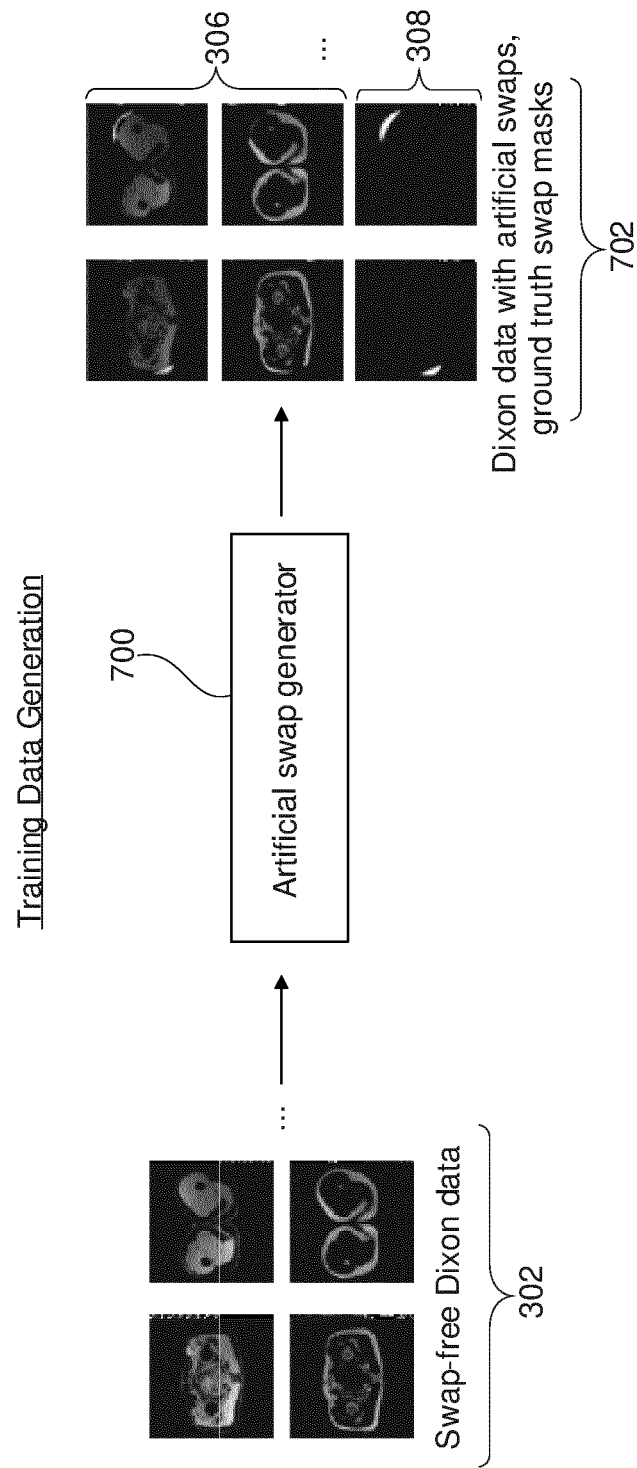
FIG. 7 illustrates a method of generating synthetic water-fat swaps.

FIG. 7 illustrates the method of generating training data 702. In this example there is an artificial water-fat swap generator 700 which is an algorithm. The artificial water-fat swap generator 700 takes swap-free Dixon magnetic resonance images 302 as input. It then outputs the training Dixon magnetic resonance images 306 and the training water-fat swap masks 308 as output. This is an example of training data 702 which was generated by making synthetic water-fat swap regions. In FIG. 7, swap-free Dixon data (water and fat image pairs are artificially modified to contain water-fat swaps. A ground truth mask is generated for each image pair.

Figure 8:
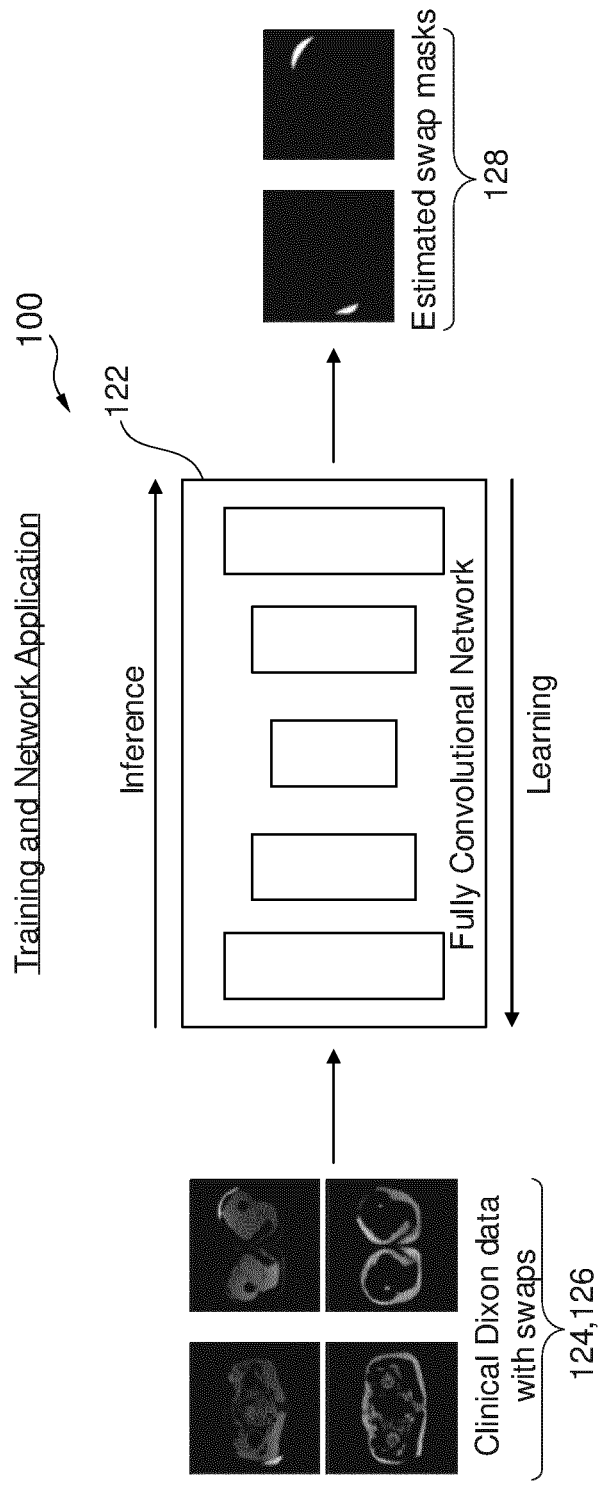
FIG. 8 illustrates a medical system with a convolutional neural network.

FIG. 8 illustrates the function of the convolutional neural network 122. The initial Dixon fat magnetic resonance image 124 and/or initial Dixon water magnetic resonance image 126 can be input into the convolutional neural network 122 and as output the one or more water-fat swap regions 128 is output. The Dixon images 124 or 126 are referred to as the clinical Dixon data with swaps in the image and the one or more water-fat swap regions 128 are identified as the estimated swap masks. When the training data 702 is used the neural network 122 can for example be used or trained using deep learning. During use of the neural network 122, the network 122 is capable of estimating swap regions given Dixon data with swaps as input.

During use, the swap mask predicted by the network (one or more water-fat swap regions 128) can be used in two ways. First, for Dixon images in which a true swapping of the water and fat signals occurs (two echoes, single-peak spectral model of fat, etc.), the swapping can easily be corrected by simply interchanging the two signals in the swapped region. Second, in all other cases, the intrinsic estimation of the B0 inhomogeneity can be corrected in the swapped region, and the water-fat separation can be repeated.

FIG. 9 illustrates the performance of the convolutional neural network 122. The images in column 900 are examples of Dixon water images with a swap artifact 900. The swap artifact in the examples 900 are artificial. Column 902 shows the output of the convolutional neural network after the images 900 have been each input into it. And 902 is an example of a water-fat swap region 902 identified by the neural network. The images in column 904 illustrate a corrected Dixon water image 904, that was corrected by interchanging the water-fat signals within the masks and it produces an almost artifact-free result.

In an additional example, the swap masks for the training dataset are at least partially created using manual segmentations. While this requires additional manual work, the resulting dataset may be assumed to be more realistic than an artificially created dataset, potentially leading to improved network performance.

In another additional example, since water-fat swaps in clinical practice mostly occur in regions with large B0 deviations, B0 maps acquired with standard B0 mapping techniques, or B0 maps based on representations such as Legendre polynomials, may be used alternatively. Regions in which the B0 inhomogeneity, or a spatial gradient of it, or a combination of both, exceeds a defined threshold may be used to define swap masks.

In a further additional example, one or more of several disconnected regions in the combined water-fat images may be used to define swap masks.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical system
102 computer
104 processor
106 hardware interface
108 optional user interface
110 memory
120 machine executable instructions
122 convolutional neural network
124 initial Dixon fat magnetic resonance image
126 initial Dixon water magnetic resonance image
128 one or more water-fat swap regions
130 corrected Dixon fat magnetic resonance image
132 corrected Dixon water magnetic resonance image
200 receive the initial Dixon magnetic resonance image
204 receive the one or more water-fat swap regions from the convolutional neural network in response to inputting the initial Dixon magnetic resonance image into the convolutional neural network
206 reconstruct a corrected Dixon magnetic resonance image using the received one or more water-fat swap regions
300 medical system
302 swap free Dixon magnetic resonance images
304 synthetic water-fat swap regions 306 training Dixon magnetic resonance image
308 training water-fat swap mask
400 receive swap free Dixon magnetic resonance images
402 generate the training data by generating synthetic water-fat swap regions in each swap free Dixon magnetic resonance image of the swap free Dixon magnetic resonance images and constructing the training water-fat swap mask
404 receive training data
406 train the convolutional neural network using the training data
500 medical system
502 magnetic resonance imaging system
504 magnet
506 bore of magnet
508 imaging zone
509 region of interest
510 magnetic field gradient coils
512 magnetic field gradient coil power supply
514 radio-frequency coil
516 transceiver
518 subject
520 subject support
530 pulse sequence commands
532 magnetic resonance imaging data
600 acquire the magnetic resonance imaging data by controlling the magnetic resonance imaging system with the pulse sequence commands
602 reconstruct the initial Dixon magnetic resonance image using the magnetic resonance imaging data according to the Dixon magnetic resonance imaging protocol
700 artificial water-fat swap generator
702 training data
900 Dixon water image with swap artifact
902 water-fat swap region
904 corrected Dixon water image

The invention claimed is:

1. A medical system comprising:
a memory configured to store machine executable instructions and a convolutional neural network previously trained using training data comprising training Dixon magnetic resonance images and training water-fat swap masks, wherein the convolutional neural network is configured to receive an initial Dixon magnetic resonance image as input, wherein the convolutional neural network is configured to identify one or more water-fat swap regions in the initial Dixon magnetic resonance image; and
a processor configured to control the medical system, wherein execution of the machine executable instructions causes the processor to:
receive the initial Dixon magnetic resonance image;
receive the one or more water-fat swap regions from the convolutional neural network in response to inputting the initial Dixon magnetic resonance image into the convolutional neural network; and
reconstruct a corrected Dixon magnetic resonance image using the received one or more water-fat swap regions.

2. A medical system comprising:
a memory configured to store machine executable instructions and a convolutional neural network, wherein the convolutional neural network is configured to receive an initial Dixon magnetic resonance image as input, wherein the convolutional neural network is configured to identify one or more water-fat swap regions in the initial Dixon magnetic resonance image; and
a processor configured to control the medical system, wherein execution of the machine executable instructions further causes the processor to:
receive training data, wherein each of the training data comprises a training Dixon magnetic resonance image and a training water-fat swap mask, wherein the training water-fat swap mask identifies a ground truth location of the one or more water-fat swap regions;
train the convolutional neural network using the training data;
receive the initial Dixon magnetic resonance image; and
receive the one or more water-fat swap regions from the convolutional neural network in response to inputting the initial Dixon magnetic resonance image into the convolutional neural network.

3. A non-transitory computer readable medium product storing machine executable instructions for execution by a processor controlling a medical system and a convolutional neural network previously trained using training data comprising training Dixon magnetic resonance images and training water-fat swap masks, wherein the convolutional neural network is configured for receiving an initial Dixon magnetic resonance image as input, wherein the convolutional neural network is configured for identifying one or more water-fat swap regions in the initial Dixon magnetic resonance image, wherein execution of the machine executable instructions causes the processor to:
receive the initial Dixon magnetic resonance image; and
receive the one or more water-fat swap regions from the convolutional neural network in response to inputting the initial Dixon magnetic resonance image into the convolutional neural network.

4. A method of training a convolutional neural network, wherein the convolutional neural network is configured for receiving an initial Dixon magnetic resonance image as input, wherein the convolutional neural network is configured for identifying one or more water-fat swap regions in the initial Dixon magnetic resonance image, wherein the method comprises
receiving training data, wherein each of the training data comprises a training Dixon magnetic resonance image and a training water-fat swap mask, wherein the training Dixon magnetic resonance image comprises the one or more water-fat swap regions, wherein the training water-fat swap mask identifies a ground truth location of the one or more water-fat swap regions; and
training the convolutional neural network using the training data.

5. The medical system of claim 1, wherein the corrected Dixon magnetic resonance image is reconstructed using any one of the following:
wherein the Dixon magnetic resonance image further comprises a fat image and a water image, wherein the corrected Dixon magnetic resonance image is reconstructed by swapping voxels of the one or more water-fat swap regions between the fat image and the water image; and
wherein the corrected Dixon magnetic resonance imaging is reconstructed from the Dixon magnetic resonance imaging data according to a Dixon magnetic resonance image reconstruction algorithm, wherein the Dixon magnetic resonance image reconstruction algorithm is configured to use the one or more water-fat swap regions as constraints and/or for correcting a $B_0$ inhomogeneity estimation.

6. The medical system of claim 2, wherein execution of the machine executable instructions further causes the processor to:
  receive swap free Dixon magnetic resonance images; and
  generate the training data by generating one or more synthetic water-fat swap regions in each swap free Dixon magnetic resonance image of the swap free Dixon magnetic resonance images and constructing the training water-fat swap mask.

7. The medical system of claim 6, wherein the training data is at least partially generated by determining at least some of the one or more synthetic water-fat swap regions by:
  determining one or more random variables;
  inputting the one or more random variables into a spatially variable function; and
  thresholding the spatially variable function to determine the one or more water-fat swap regions for the training Dixon magnetic resonance image.

8. The medical system of claim 6, wherein the training data is at least partially generated by:
  identifying high water-fat zones in the Dixon magnetic resonance image with both a fat content and a water contend above a predetermined water-fat threshold; and
  selecting at least a portion of the high water-fat zones as the synthetic water-fat swap regions.

9. The medical system of claim 6, wherein the training data is at least partially generated by:
  receiving a $B_0$ inhomogeneity map for the swap free Dixon magnetic resonance images;
  identifying high $B_0$ inhomogeneity zones in the swap free Dixon magnetic resonance images by thresholding the $B_0$ inhomogeneity map with a $B_0$ inhomogeneity threshold; and
  selecting at least a portion of the high $B_0$ inhomogeneity zones as the synthetic water-fat swap regions.

10. The medical system of claim 7, wherein the training data is at least partially generated by:
  identifying tissue boundary zones in the swap free Dixon magnetic resonance image using an image segmentation algorithm; and
  selecting at least a portion of the tissue boundary zones as the synthetic water-fat swap regions.

11. The medical system of claim 7, wherein the training data is at least partially generated by:
  determining a spatially dependent signal to noise map for the Dixon magnetic resonance image; and
  selecting at least a portion of the synthetic water-fat swap regions for inclusion in the training data using a signal to noise weighting factor determined using the spatially dependent signal to noise map, wherein the signal to noise weighting factor increases as the spatially dependent signal to noise map decreases.

12. The medical system of claim 6, wherein the training data is at least partially generated by:
  receiving an isocenter location for the swap free Dixon magnetic resonance image; and
  selecting at least a portion of synthetic water-fat swap regions for inclusion in the training data using a distance weighting factor determined by a distance from the isocenter location, wherein the distance weighting factor increases as the distance from the isocenter location increases.

13. The medical system of claim 2, wherein the training data is at least partially generated by increasing size of the training data by generating additional training ground truth magnetic resonance images by applying an image transformation to both the training Dixon magnetic resonance images as well as the training water-fat swap mask, wherein the image transformation comprises at least one of an image translation, an image rotation, an image deformation, an image flipping transformation, or a mirror image transformation.

14. The medical system of claim 1, further comprising:
  a magnetic resonance imaging system, wherein the memory further contains pulse sequence commands configured for controlling the magnetic resonance imaging system to acquire magnetic resonance imaging data according to a Dixon magnetic resonance imaging protocol, wherein execution of the machine executable instructions further cause the processor to:
  acquire the magnetic resonance imaging data by controlling the magnetic resonance imaging system with the pulse sequence commands; and
  reconstruct the initial Dixon magnetic resonance image using the magnetic resonance imaging data according to the Dixon magnetic resonance imaging protocol.

15. The method of claim 4, further comprising:
  receiving swap free Dixon magnetic resonance images; and
  generating the training data by generating synthetic water-fat swap regions in the swap free Dixon magnetic resonance images.

16. The medical system of claim 2, wherein execution of the machine executable instructions further causes the processor to reconstruct a corrected Dixon magnetic resonance image using the received one or more water-fat swap regions.

17. The medical system of claim 16, wherein the corrected Dixon magnetic resonance image is reconstructed by:
  swapping voxels of the one or more water-fat swap regions between a fat image and a water image included in the Dixon magnetic resonance image; or
  using one or more water-fat swap regions as constraints and/or for correcting a $B_0$ inhomogeneity estimation to reconstruct the corrected Dixon magnetic resonance image from the Dixon magnetic resonance imaging data according to a Dixon magnetic resonance image reconstruction algorithm.

18. The non-transitory computer readable medium product of claim 3, wherein execution of the machine executable instructions further causes the processor to reconstruct a corrected Dixon magnetic resonance image using the received one or more water-fat swap regions.

19. The non-transitory computer readable medium product of claim 18, wherein the Dixon magnetic resonance image is corrected using any one of the following:
  wherein the Dixon magnetic resonance image further comprises a fat image and a water image, wherein the corrected Dixon magnetic resonance image is reconstructed by swapping voxels of the one or more water-fat swap regions between the fat image and the water image; and
  wherein the corrected Dixon magnetic resonance imaging is reconstructed from the Dixon magnetic resonance imaging data according to a Dixon magnetic resonance image reconstruction algorithm, wherein the Dixon magnetic resonance image reconstruction algorithm is configured to use the one or more water-fat swap regions as constraints and/or for correcting a $B_0$ inhomogeneity estimation.

20. The non-transitory computer readable medium product of claim 3, further storing pulse sequence commands configured for controlling a magnetic resonance imaging system to acquire magnetic resonance imaging data according to a Dixon magnetic resonance imaging protocol, wherein execution of the machine executable instructions further causes the processor to:
   acquire the magnetic resonance imaging data by controlling the magnetic resonance imaging system with the pulse sequence commands; and
   reconstruct the initial Dixon magnetic resonance image using the magnetic resonance imaging data according to the Dixon magnetic resonance imaging protocol.

* * * * *